United States Patent
Arayashiki

(10) Patent No.: US 9,941,006 B1
(45) Date of Patent: Apr. 10, 2018

(54) MEMORY DEVICE AND METHOD FOR DRIVING SAME

(71) Applicant: TOSHIBA MEMORY CORPORATION, Tokyo (JP)

(72) Inventor: Yusuke Arayashiki, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/460,600

(22) Filed: Mar. 16, 2017

Related U.S. Application Data

(60) Provisional application No. 62/395,670, filed on Sep. 16, 2016.

(51) Int. Cl.
| | |
|---|---|
| *G11C 5/06* | (2006.01) |
| *G11C 13/00* | (2006.01) |
| *H01L 45/00* | (2006.01) |
| *H01L 27/24* | (2006.01) |

(52) U.S. Cl.
CPC ........ *G11C 13/0069* (2013.01); *G11C 13/004* (2013.01); *G11C 13/0097* (2013.01); *H01L 27/249* (2013.01); *H01L 27/2454* (2013.01); *H01L 45/085* (2013.01); *H01L 45/1233* (2013.01); *H01L 45/1253* (2013.01); *H01L 45/145* (2013.01)

(58) Field of Classification Search
CPC . G11C 13/069; G11C 13/004; G11C 13/0097; H01L 45/085; H01L 45/1223; H01L 45/145; H01L 27/2454; H01L 27/249

USPC .............................. 365/148, 63, 51
See application file for complete search history.

(56) References Cited

U.S. PATENT DOCUMENTS

| | | | |
|---|---|---|---|
| 2007/0291527 A1 | 12/2007 | Tsushima et al. | |
| 2008/0149913 A1* | 6/2008 | Tanaka ............... | H01L 27/2454 257/5 |
| 2010/0176488 A1* | 7/2010 | Aoyama ............ | H01L 27/1021 257/536 |
| 2011/0044089 A1 | 2/2011 | Goux et al. | |
| 2011/0175048 A1* | 7/2011 | Sekine ............... | H01L 27/2409 257/2 |

(Continued)

FOREIGN PATENT DOCUMENTS

| | | |
|---|---|---|
| JP | 2007-294638 A | 11/2007 |
| JP | 2007-328857 A | 12/2007 |

(Continued)

*Primary Examiner* — Viet Q Nguyen
(74) *Attorney, Agent, or Firm* — Foley & Lardner LLP

(57) ABSTRACT

A memory device includes a first interconnect extending in a first direction, a second interconnect extending in a second direction crossing the first direction, a third interconnect extending in a third direction crossing a plane including the first direction and the second direction, a fourth interconnect extending in the third direction, a semiconductor member, a first resistance change film, and a second resistance change film. The semiconductor member is connected between a first end of the second interconnect and the first interconnect. The first resistance change film is connected between a side surface of the second interconnect and the third interconnect. The second resistance change film is connected between a second end of the second interconnect and the fourth interconnect.

11 Claims, 5 Drawing Sheets

(56) References Cited

U.S. PATENT DOCUMENTS

| | | | |
|---|---|---|---|
| 2011/0193136 A1* | 8/2011 | Moritoki | H01L 21/76895 257/211 |
| 2011/0291063 A1* | 12/2011 | Kai | H01L 27/2409 257/2 |
| 2011/0303888 A1* | 12/2011 | Fukumizu | H01L 27/2409 257/2 |
| 2013/0100726 A1 | 4/2013 | Yi et al. | |
| 2013/0187118 A1* | 7/2013 | Murooka | H01L 45/04 257/4 |
| 2013/0248795 A1* | 9/2013 | Takahashi | G11C 13/0011 257/1 |
| 2015/0061025 A1* | 3/2015 | Nakazawa | H01L 21/76802 257/368 |
| 2015/0069314 A1* | 3/2015 | Arayashiki | H01L 45/085 257/2 |
| 2015/0255515 A1* | 9/2015 | Nakai | H01L 27/2481 365/148 |
| 2016/0267968 A1* | 9/2016 | Murooka | G11C 13/0002 |

FOREIGN PATENT DOCUMENTS

| | | |
|---|---|---|
| JP | 2010-140530 A | 6/2010 |
| JP | 2011-009739 A | 1/2011 |

* cited by examiner

| | S1 LOWER RESISTANCE OF MEMORY CELL MC2 | S2 READ MEMORY CELL MC2 | S3 WRITE MEMORY CELL MC1 | S4 RAISE RESISTANCE OF MEMORY CELL MC2 | S5 READ MEMORY CELL MC1 | S6 ERASE MEMORY CELL MC1 |
|---|---|---|---|---|---|---|
| SELECTED WRITE WORD LINE | $V_{set2}$ | $V_{read2}$ | $V_{set1}$ | 0V | 0V or Float | 0V or Float |
| NON-SELECTED WRITE WORD LINE | ½ $V_{set2}$ | ½ $V_{read2}$ | ½ $V_{set1}$ | ½ $V_{reset2}$ | 0V or Float | 0V or Float |
| SELECTED WORD LINE | 0V or Float | 0V or Float | 0V | 0V or Float | 0V | $V_{reset1}$ |
| NON-SELECTED WORD LINE | 0V or Float | 0V or Float | ½ $V_{set1}$ | 0V or Float | ½ $V_{read1}$ | ½ $V_{reset1}$ |
| SELECTED GATE ELECTRODE | $V_{SG}$ | $V_{SG}$ | 0V or Float | $V_{SG}$ | $V_{SG}$ | $V_{SG}$ |
| NON-SELECTED GATE ELECTRODE | 0V or Float | 0V or Float | 0V or Float | 0V or Float | 0V or Float | 0V or Float |
| SELECTED GLOBAL BIT LINE | 0V | 0V | 0V or Float | $V_{reset2}$ | $V_{read1}$ | 0V |
| NON-SELECTED GLOBAL BIT LINE | ½ $V_{set2}$ | ½ $V_{read2}$ | 0V or Float | ½ $V_{reset2}$ | ½ $V_{read1}$ | ½ $V_{reset1}$ |

FIG. 5

MEMORY DEVICE AND METHOD FOR DRIVING SAME

CROSS-REFERENCE TO RELATED APPLICATIONS

This application is based upon and claims the benefit of priority from U.S. Provisional Patent Application 62/395,670, filed on Sep. 16, 2016; the entire contents of which are incorporated herein by reference.

FIELD

Embodiments relate to a memory device and a method for driving the same.

BACKGROUND

In recent years, there has been proposed a memory device in which resistance change memory cells are integrated in three dimensions. In such a memory device, a resistance change film is provided between a word line and a bit line. Data are stored by controlling the resistance value of this resistance change film. Also in such a resistance change memory device, multivalued operation of memory cells is desired to increase the memory density of data.

BRIEF DESCRIPTION OF THE DRAWINGS

FIG. 5 is a timing chart showing an operation of the memory device according to the embodiment, while a horizontal axis representing time, and a vertical axis representing a potential applied to each interconnect.

DETAILED DESCRIPTION

A memory device according to an embodiment includes a first interconnect extending in a first direction, a second interconnect extending in a second direction crossing the first direction, a third interconnect extending in a third direction crossing a plane including the first direction and the second direction, a fourth interconnect extending in the third direction, a semiconductor member, a first resistance change film, and a second resistance change film. The semiconductor member is connected between a first end of the second interconnect and the first interconnect. The first resistance change film is connected between a side surface of the second interconnect and the third interconnect. The second resistance change film is connected between a second end of the second interconnect and the fourth interconnect.

Embodiments of the invention will now be described with reference to the drawings.

Figure 1:
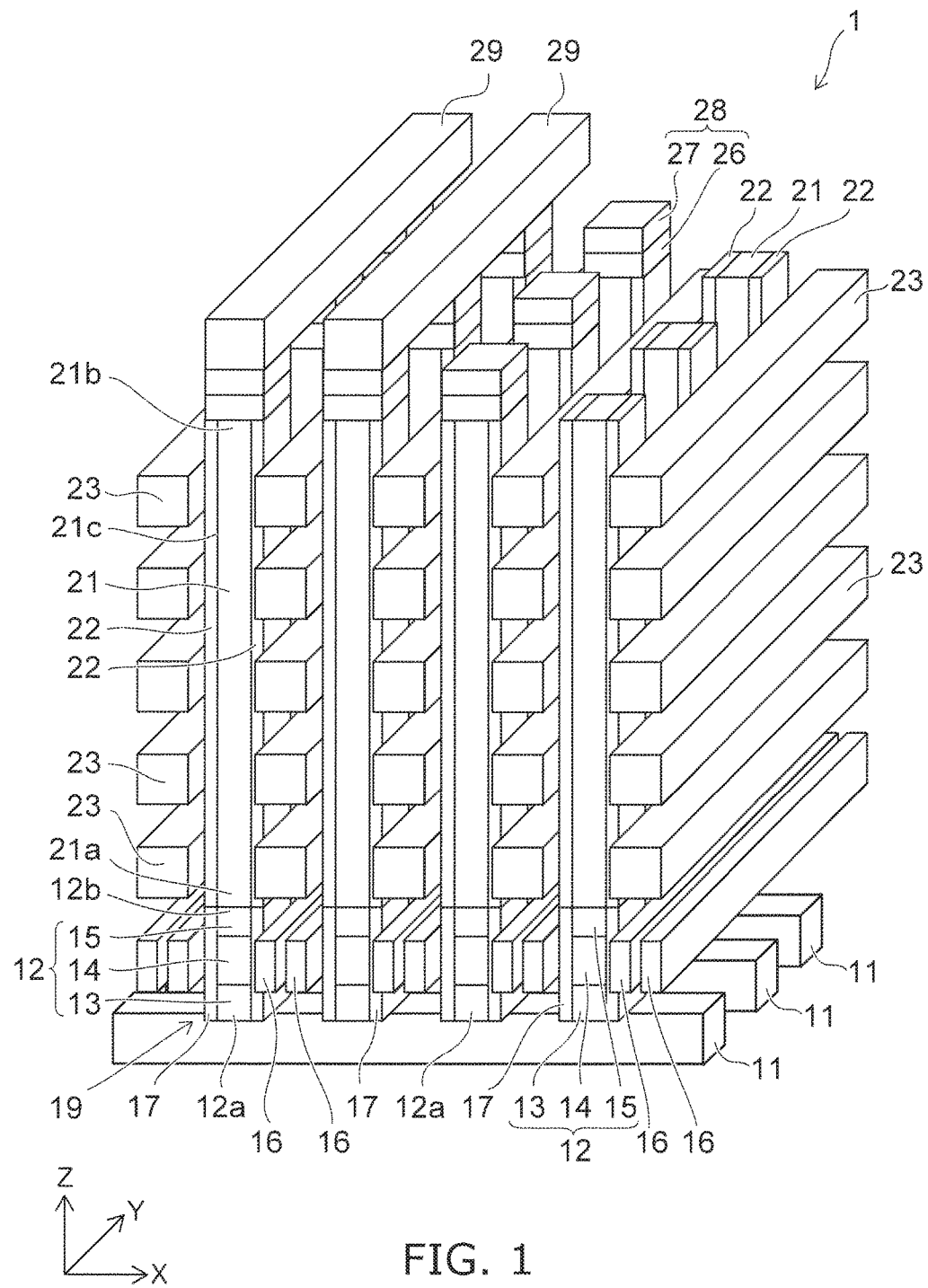
FIG. 1 is a perspective view showing a memory device according to an embodiment.

FIG. 1 is a perspective view showing a memory device according to the embodiment.

Figure 2:
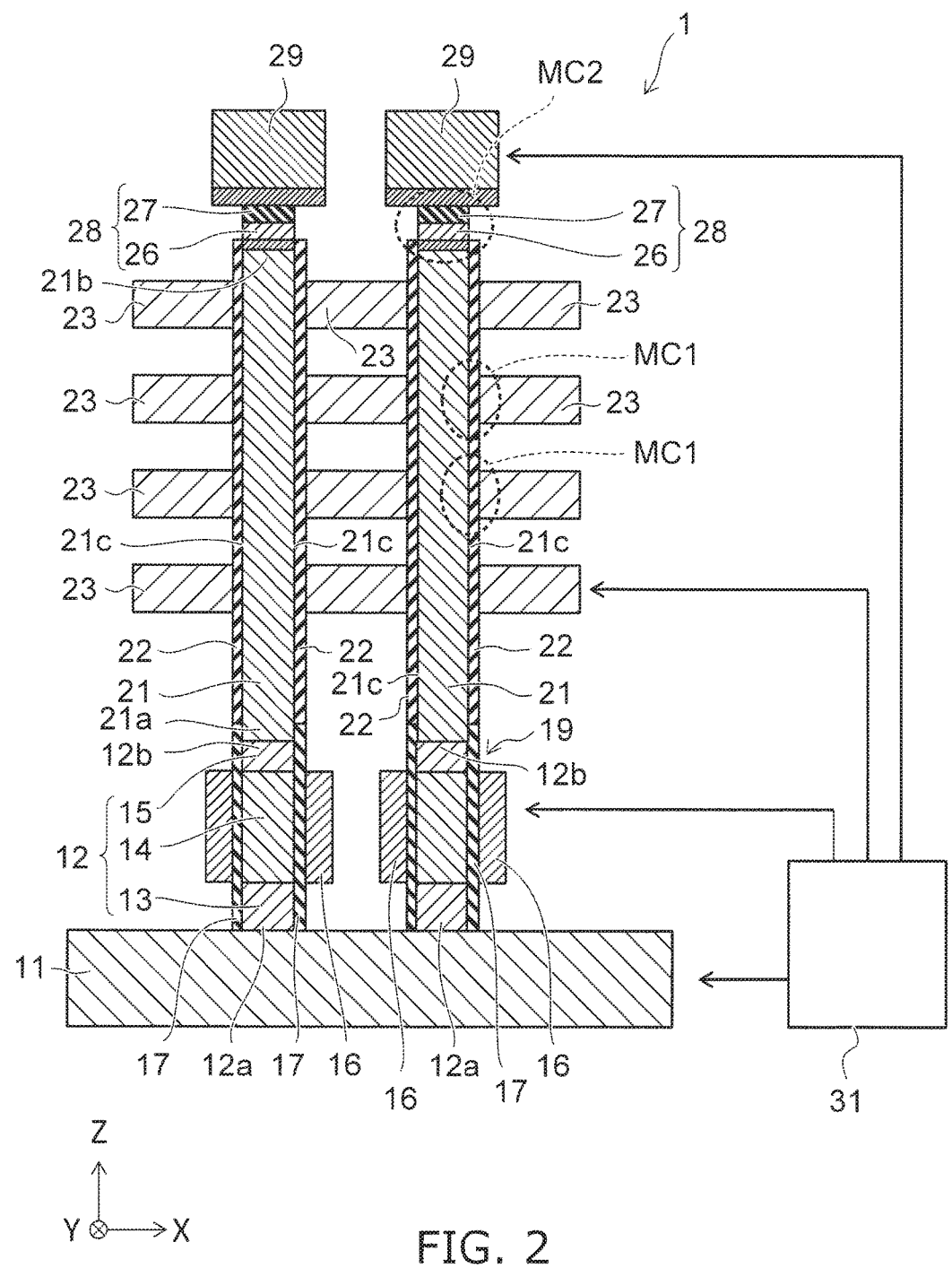
FIG. 2 is a sectional view showing the memory device according to the embodiment.

FIG. 2 is a sectional view showing the memory device according to the embodiment.

As shown in FIGS. 1 and 2, the memory device 1 according to the embodiment includes a plurality of global bit lines 11. The global bit lines 11 are formed by partitioning an upper portion of a silicon substrate (not shown) by a device isolation insulator (not shown). Alternatively, the global bit lines 11 are formed by providing an insulating film (not shown) on a silicon substrate and depositing polysilicon thereon.

In the following, an XYZ orthogonal coordinate system is adopted in the specification. The extending direction of the global bit lines 11 is referred to as "X-direction". The arranging direction of the global bit lines 11 is referred to as "Y-direction". The direction orthogonal to the X-direction and the Y-direction is referred to as "Z-direction". One side of the Z-direction is also referred to as "upper", and the other is also referred to as "lower". However, these expressions are used for convenience, and irrelevant to the direction of gravity.

A plurality of silicon members 12 are provided on each global bit line 11. As viewed in the Z-direction, the silicon members 12 are arranged in a matrix along the X-direction and the Y-direction. Each silicon member 12 is shaped like a rectangular solid with the longitudinal direction in the Z-direction. The lower ends 12a of a plurality of silicon members 12 arranged in a line along the X-direction are commonly connected to one global bit line 11.

Each silicon member 12 includes an $n^+$-type portion 13, a $p^-$-type portion 14, and an $n^+$-type portion 15 arranged in this order along the Z-direction from the lower side, i.e., from the global bit line 11 side toward the upper side. The relationship between the n-type and the p-type may be reversed.

Two gate electrodes 16 extending in the Y-direction are provided between the silicon members 12 in the X-direction. The gate electrode 16 is formed from e.g. polysilicon. As viewed in the X-direction, the gate electrode 16 overlaps an upper part of the $n^+$-type portion 13, the entirety of the $p^-$-type portion 14, and a lower part of the $n^+$-type portion 15.

A gate insulating film 17 made of e.g. silicon oxide is provided between the silicon member 12 and the gate electrode 16. The silicon member 12 including the $n^+$-type portion 13, the $p^-$-type portion 14, and the $n^+$-type portion 15, the gate insulating film 17, and a pair of gate electrodes 16 sandwiching the silicon member 12 constitute a TFT 19 of e.g. n-channel type. The TFT 19 is a switching element for switching between conduction and interruption of current.

A local bit line 21 is provided on the silicon member 12. The local bit line 21 extends in the Z-direction. The local bit line 21 is shaped like e.g. a quadrangular prism. More specifically, the longitudinal direction of the local bit line 21 is the Z-direction. The length in the Z-direction of the local bit line 21 is longer than the length in the X-direction and the length in the Y-direction. The lower end 21a and the upper end 21b of the local bit line 21 are both ends in the Z-direction of the local bit line 21.

The lower end 21a of the local bit line 21 is connected to the upper end 12b of the silicon member 12. Each local bit line 21 is placed directly above the corresponding silicon member 12. Thus, in the memory device 1 as a whole, a plurality of local bit lines 21 are arranged in a matrix along the X-direction and the Y-direction.

A resistance change film 22 is provided on both side surfaces 21c facing the X-direction of the local bit line 21. The resistance change film 22 is a film in which the resistance state is changed by the voltage or current applied thereto. The resistance change film 22 is made of e.g. metal oxide such as hafnium oxide ($HfO_2$). The resistance change film 22 may be a CBRAM (conductive bridging random access memory) film or PCRAM (phase change random access memory) film.

A plurality of word lines 23 extending in the Y-direction are provided between the local bit lines 21 adjacent in the X-direction, and spaced from each other in the Z-direction. As viewed in the Y-direction, the word lines 23 are arranged in a matrix along the X-direction and the Z-direction. The resistance change film 22 is connected between the local bit line and the word line 23. Thus, a memory cell MC1 is constituted via the resistance change film 22 for each crossing portion of the local bit line 21 and the word line 23. The memory cells MC1 are arranged in a three-dimensional matrix along the X-direction, the Y-direction, and the Z-direction.

A nonlinear resistance layer 26 is provided on the upper end 21b of the local bit line 21. The resistance value of the nonlinear resistance layer 26 depends on the applied voltage. The resistance value is lower for a higher voltage. The nonlinear resistance layer 26 is formed from e.g. tantalum silicon nitride (TaSiN) or titanium silicon nitride (TiSiN). A resistance change layer 27 is provided on the nonlinear resistance layer 26. The resistance change layer 27 is e.g. a CBRAM layer in which e.g. a silicon oxide layer and a silver layer are stacked. The nonlinear resistance layer 26 and the resistance change layer 27 form a resistance change film 28. As described later, the resistance change film 28 can assume three or more states different in resistance value.

A plurality of write word lines 29 extending in the Y-direction are provided on the resistance change film 28. The plurality of write word lines 29 are arranged periodically along the X-direction. Thus, the local bit lines 21 arranged along the Y-direction are commonly connected to one write word line 29 via the respective resistance change films 28. The nonlinear resistance layer 26 and the resistance change layer 27 are connected in series between the local bit line 21 and the write word line 29. As a result, a memory cell MC2 is constituted via the resistance change film 28 for each crossing portion of the local bit line 21 and the write word line 29. The memory cells MC2 are arranged in a matrix along the X-direction and the Y-direction. In FIG. 1, part of the resistance change films 28 and part of the write word lines are not shown for clarity of illustration.

The memory device 1 further includes a control circuit 31. The control circuit 31 is placed e.g. around the region provided with the global bit line 11 in the silicon substrate (not shown), or between the silicon substrate and the global bit line 11.

Next, the operation of the memory device according to the embodiment is described.

First, the operational principle of the memory device 1 according to the embodiment is briefly described.

The memory cell MC1 stores data in correspondence with a plurality of resistance states of the resistance change film 22. The memory cell MC2 assumes three or more states different in resistance value. Thus, the memory cell MC2 determines the magnitude of the maximum current, i.e., compliance current, passed at write operation of the memory cell MC1. Difference in the magnitude of the compliance current passed at write operation of the memory cell MC1 results in different resistance states of the memory cell MC1 after setting. Thus, the memory cell MC1 can assume a plurality of resistance states after setting. The plurality of resistance states after setting and a resistance state before setting amount to three or more resistance states that can be assumed by the memory cell MC1. This enables multivalued memory.

In the following, the operation of each part is described in detail.

First, the behavior of the memory cell MC2 is described.

Figure 3A:
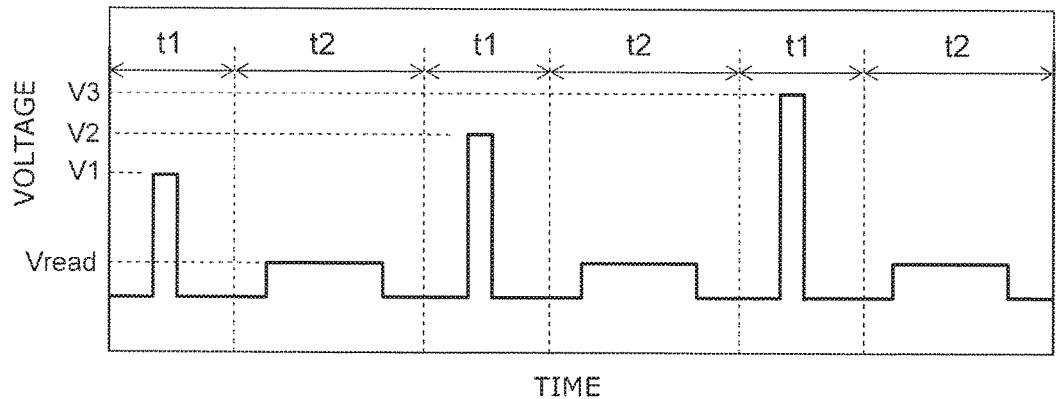
FIG. 3A is a timing chart showing voltage applied to a resistance change film, while a horizontal axis representing time, and a vertical axis representing voltage.
Figure 3B:
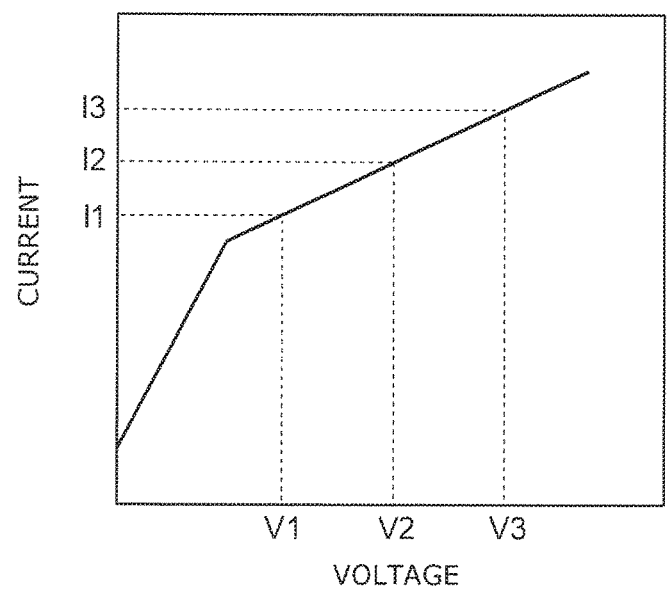
FIG. 3B is a graph showing a behavior of a memory cell MC2, while a horizontal axis representing voltage applied to the resistance change film in a voltage application period, and a vertical axis representing current flowing in the resistance change film in a current measurement period.

FIG. 3A is a timing chart showing the voltage applied to the resistance change film. The horizontal axis represents time, and the vertical axis represents voltage. FIG. 3B is a graph showing the behavior of the memory cell MC2. The horizontal axis represents the voltage applied to the resistance change film in the voltage application period. The vertical axis represents the current flowing in the resistance change film in the current measurement period.

FIGS. 3A and 3B show a test example for characterizing the memory cell MC2. In the test example shown in FIGS. 3A and 3B, it is assumed that in the initial state, the resistance change film 28 is in the high resistance state, i.e., the state of highest resistance value among the states that can be assumed by the resistance change film 28. For instance, the resistance change layer 27 is a CBRAM layer made of a silicon oxide layer and a silver layer. In this case, this is a state in which no silver filament is formed in the silicon oxide layer.

From this state, as shown in FIG. 3A, in a voltage application period t1, a write voltage is applied to the memory cell MC2 for a certain time. This lowers the resistance value of the resistance change film 28. In the aforementioned example, silver atoms contained in the silver layer are ionized and carried into the silicon oxide layer. The silver ions are combined with electrons and precipitated in the silicon oxide layer to form a fine filament of silver. Next, in a current measurement period t2, a certain read voltage Vread is applied to the memory cell MC2 to measure the value of current flowing in the memory cell MC2. For instance, the write voltage applied to the memory cell MC2 in the voltage application period t1 is denoted by and the current flowing in the current measurement period t2 is denoted by I1.

This cycle is repeated by sweeping the write voltage. That is, the write voltage is increased step by step for each voltage application period t1. For a higher write voltage, the resistance value of the resistance change layer 27 is lower. In the aforementioned example, the silver filament formed in the silicon oxide layer becomes thicker and more robust. Furthermore, for a higher write voltage, the resistance value of the nonlinear resistance layer 26 is lower. Thus, of the voltage applied to the entirety of the resistance change film 28, the voltage applied to the nonlinear resistance layer 26 decreases. By this amount, the voltage applied to the resistance change layer 27 increases. This further lowers the resistance value of the resistance change layer 27. By such synergy between the nonlinear resistance layer 26 and the resistance change layer 27, for a higher write voltage, the resistance value of the resistance change film 28 is lower.

As a result, as shown in FIG. 3B, for different write voltages applied in the voltage application period t1, the memory cell MC2 exhibits different read currents flowing in the current measurement period t2. For a higher write voltage, the read current is larger. That is, $V1<V2<V3$ results in $I1<I2<I3$. In other words, for a higher write voltage, the resistance value of the memory cell MC2 is lower. Thus, the resistance value of the memory cell MC2 can be controlled by adjusting the height of the write voltage.

Next, the behavior of the memory cell MC1 is described.

Figure 4:
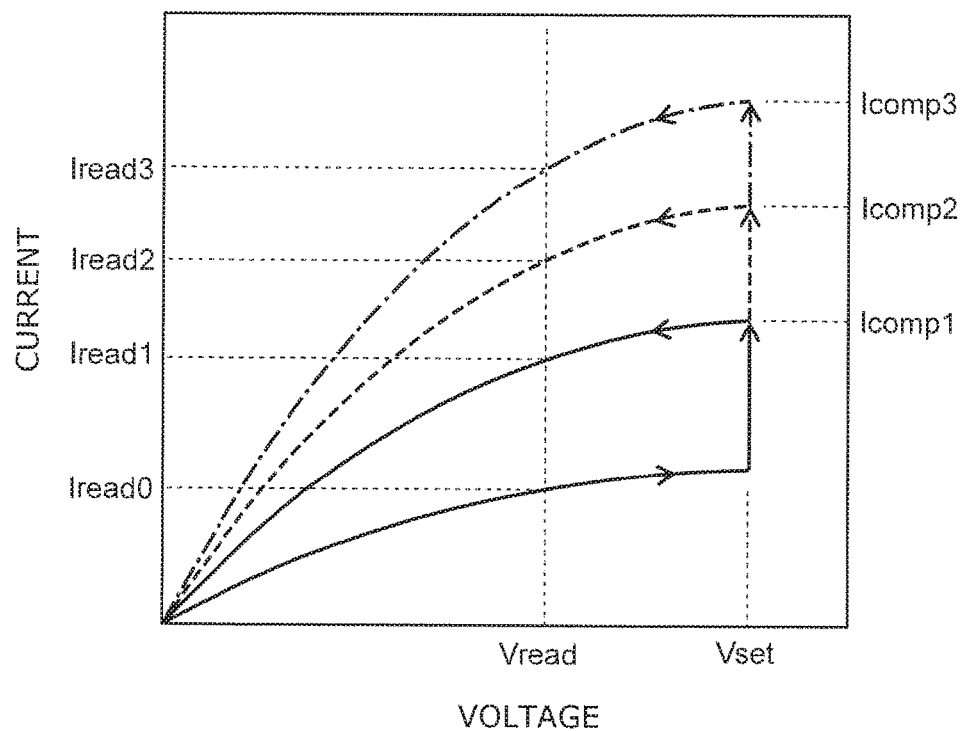
FIG. 4 is a graph showing a behavior of a memory cell MC1, while a horizontal axis representing voltage, and a vertical axis representing current.

FIG. 4 is a graph showing the behavior of the memory cell MC1. The horizontal axis represents voltage, and the vertical axis represents current.

As shown in FIG. 4, the voltage applied to the memory cell MC1 in the high resistance state is continuously increased from zero. When the voltage reaches the set voltage Vset, the resistance change film 22 is set. Thus, the memory cell MC1 is changed to a low resistance state. However, the state reached by the memory cell MC1 depends on the magnitude of the compliance current at the set time. For a larger compliance current, the resistance value of the memory cell MC1 is lower. Thus, the magnitude of the current flowing upon application of a prescribed read voltage Vread to the memory cell MC1 also depends on the magnitude of the compliance current at the set time.

In the example shown in FIG. 4, the magnitude of the compliance current assumes three levels of Icomp1, Icomp2, and Icomp3. The read currents of the memory cell MC1 after being set by these compliance currents are Iread1, Iread2, and Iread3, respectively. In the case of performing no set operation, i.e., when the memory cell MC1 is in the high resistance state, the read current flowing upon application of the read voltage Vread is Iread0. Thus, the read currents of the memory cell MC1 can assume four levels in total. Data of 2 bits can be stored by assigning values "00", "01", "10", and "11" to these levels.

Next, the overall operation of the memory device according to the embodiment is described specifically.

FIG. 5 is a timing chart showing the operation of the memory device according to the embodiment. The horizontal axis represents time, and the vertical axis represents the potential applied to each interconnect.

It is assumed that in the initial state, the memory cell MC1 and the memory cell MC2 are both in the high resistance state.

As shown in step S1 of FIG. 5, first, a memory cell MC1 to be written is selected. The memory cell MC2 connected to the memory cell MC1 thus selected is turned to low resistance.

Specifically, the control circuit 31 applies a set potential $V_{set2}$ of the memory cell MC2 to the selected write word line 29, and applies a potential of $V_{set2}/2$ equal to half the set potential $V_{set2}$ to the non-selected write word line 29. Furthermore, the control circuit 31 applies 0 V to both the selected word line 23 and the non-selected word line 23, or places them in the floating state. The control circuit 31 applies an on-potential $V_{SG}$ to the selected gate electrode 16. The control circuit 31 applies 0 V to the non-selected gate electrode 16, or places it in the floating state. The control circuit 31 applies 0 V to the selected global bit line 11, and applies a potential of $V_{set2}/2$ to the non-selected global bit line 11.

Thus, the selected TFT 19 turns to the conducting state. The selected local bit line 21 is applied through the TFT 19 with a potential of 0 V applied to the selected global bit line 11. On the other hand, the selected write word line 29 is applied with the set potential $V_{set2}$ of the memory cell MC2. Thus, the selected memory cell MC2 is applied with a voltage of $V_{set2}$–0. As a result, the memory cell MC2 is set and turns to the low resistance state. However, as described above, the low resistance state of the memory cell MC2 has a plurality of levels. The memory cell MC2 assumes one of these levels. In other words, the resistance change film 28 turns to a state except the state of highest resistance value among the three or more possible states. On the other hand, the non-selected memory cell MC2 is applied with a potential of $V_{set2}/2$ on both sides, or placed in the floating state on the local bit line 21 side. Thus, the non-selected memory cell MC2 is not set.

Next, as shown in step S2 of FIG. 5, read operation is performed on the memory cell MC2 to verify whether it is placed in an appropriate state.

Specifically, the control circuit 31 applies a read potential $V_{read2}$ of the memory cell MC2 to the selected write word line 29, and applies a potential of $V_{read2}/2$ equal to half the read potential $V_{read2}$ to the non-selected write word line 29. Furthermore, the control circuit 31 applies 0 V to both the selected word line 23 and the non-selected word line 23, or places them in the floating state. The control circuit 31 applies the on-potential $V_{SG}$ to the selected gate electrode 16. The control circuit 31 applies 0 V to the non-selected gate electrode 16, or places it in the floating state. The control circuit 31 applies 0 V to the selected global bit line 11, and applies a potential of $V_{read2}/2$ to the non-selected global bit line 11.

Thus, the selected local bit line 21 is applied with 0 V from the selected global bit line 11 through the TFT 19 placed in the conducting state. Furthermore, the selected write word line 29 is applied with the read potential $V_{read2}$ of the memory cell MC2. Thus, the selected memory cell MC2 is applied with a voltage of $V_{read2}$–0. As a result, a current flows in the path made of the write word line 29, the memory cell MC2, the local bit line 21, the silicon member 12, and the global bit line 11. The magnitude of this current is measured by a sense amplifier of the control circuit 31. Thus, the resistance state of the memory cell MC2 can be verified.

The aforementioned steps S1 and S2 may be repeated until the memory cell MC2 turns to a prescribed resistance state.

Next, as shown in step S3 of FIG. 5, data is written to the selected memory cell MC1. At this time, the memory cell MC2 has been placed in a prescribed resistance state except the state of highest resistance value.

Specifically, the control circuit 31 applies a set potential $V_{set1}$ of the memory cell MC1 to the selected write word line 29, and applies a potential of $V_{set1}/2$ equal to half the set potential $V_{set1}$ to the non-selected write word line 29. Furthermore, the control circuit 31 applies 0 V to the selected word line 23, and applies a potential of $V_{set1}/2$ to the non-selected word line 23. The control circuit 31 applies 0 V to all the gate electrodes 16 and all the global bit lines 11, or places them in the floating state.

Thus, all the TFTs 19 turn to the non-conducting state. The local bit line 21 is applied with the set potential $V_{set1}$ from the selected write word line 29 through the memory cell MC2. The selected word line 23 is applied with 0 V. Thus, the selected memory cell MC1 is applied with a voltage of $V_{set1}$–0. As a result, the selected memory cell MC1 is set and turns to the low resistance state. The moment the memory cell MC1 is set, a large current flows in the path made of the write word line 29, the memory cell MC2, the local bit line 21, the memory cell MC1, and the word line 23. However, the maximum of the current flowing at this time, i.e., compliance current, is determined by the resistance state of the memory cell MC2. The resistance state of the memory cell MC1 after setting depends on the magnitude of the compliance current. Thus, the resistance state of the selected memory cell MC1 is also determined by the resistance state of the memory cell MC2. On the other hand, the non-selected memory cell MC1 is applied with a voltage of $V_{set1}/2$ or 0 V. Thus, the non-selected memory cell MC1 is not set. Accordingly, data is written to the selected memory cell MC1.

Next, as shown in step S4 of FIG. 5, the memory cell MC2 is turned to high resistance.

Specifically, the control circuit 31 applies 0 V to the selected write word line 29, and applies a potential of $V_{reset2}/2$ equal to half a reset potential $V_{reset2}$ to the non-selected write word line 29. Furthermore, the control circuit 31 applies 0 V to all the word lines 23, or places them in the floating state. The control circuit 31 applies the on-potential $V_{SG}$ to the selected gate electrode 16. The control circuit 31 applies 0 V to the non-selected gate electrode 16, or places it in the floating state. The control circuit 31 applies the reset potential $V_{reset2}$ to the selected global bit line 11, and applies a potential of $V_{set2}/2$ to the non-selected global bit line 11.

Thus, the selected TFT 19 turns to the conducting state. The selected local bit line 21 is applied through the TFT 19 with the reset potential $V_{reset2}$ applied to the selected global bit line 11. On the other hand, the selected write word line 29 is applied with 0 V. Thus, the selected memory cell MC2 is applied with a voltage of $V_{reset2}-0$. As a result, the memory cell MC2 is reset and turns to the high resistance state, i.e., the state of highest resistance value among the possible states. On the other hand, the non-selected memory cell MC2 is applied with a potential of $V_{reset2}/2$ on both sides, or placed in the floating state on the local bit line 21 side. Thus, the non-selected memory cell MC2 is not reset. At the time of read operation and erase operation of the memory cell MC1 described below, the memory cell MC2 is always placed in the high resistance state.

Next, as shown in step S5 of FIG. 5, data is read from the memory cell MC1.

Specifically, the control circuit 31 applies 0 V to all the write word lines 29, or places them in the floating state. The control circuit 31 applies 0 V to the selected word line 23, and applies a potential of $V_{read1}/2$ equal to half a read potential $V_{read1}$ to the non-selected word line 23. The control circuit 31 applies the on-potential $V_{SG}$ to the selected gate electrode 16. The control circuit 31 applies 0 V to the non-selected gate electrode 16, or places it in the floating state. The control circuit 31 applies the read potential $V_{read1}$ to the selected global bit line 11, and applies a potential of $V_{read1}/2$ to the non-selected global bit line 11.

Thus, the selected local bit line 21 is applied with the read potential $V_{read1}$ applied to the selected global bit line 11 through the TFT 19 placed in the conducting state. Furthermore, the selected word line 23 is applied with 0 V. Thus, the selected memory cell MC1 is applied with a voltage of $V_{read1}-0$. As a result, a current flows in the path made of the word line 23, the memory cell MC1, the local bit line 21, the silicon member 12, and the global bit line 11. The magnitude of this current is measured by the sense amplifier of the control circuit 31. Thus, the resistance state of the memory cell MC1 can be evaluated, and the value stored in the memory cell MC1 can be read. On the other hand, the non-selected memory cell MC1 is applied with a potential of $V_{read1}/2$ on both sides, or placed in the floating state on the local bit line 21 side. Thus, no substantial current flows therein. At this time, all the memory cells MC2 are placed in the high resistance state, and all the write word lines 29 are placed at 0 V or in the floating state. Thus, no substantial current flows from the local bit line 21 to the write word line 29.

Next, as shown in step S6 of FIG. 5, data is erased from the memory cell MC1.

Specifically, the control circuit 31 applies 0 V to all the write word lines 29, or places them in the floating state. The control circuit 31 applies a reset potential $V_{reset1}$ of the memory cell MC1 to the selected word line 23, and applies a potential of $V_{reset1}/2$ equal to half the reset potential $V_{reset1}$ to the non-selected word line 23. The control circuit 31 applies the on-potential $V_{SG}$ to the selected gate electrode 16. The control circuit 31 applies 0 V to the non-selected gate electrode 16, or places it in the floating state. The control circuit 31 applies 0 V to the selected global bit line 11, and applies a potential of $V_{reset1}/2$ to the non-selected global bit line 11.

Thus, the selected local bit line 21 is applied with 0 V from the selected global bit line 11 through the TFT 19 placed in the conducting state. Furthermore, the selected word line 23 is applied with the reset potential $V_{reset1}$. Thus, the selected memory cell MC1 is applied with a voltage equal to the reset potential $V_{reset1}-0$. As a result, the selected memory cell MC1 is reset and turns to the high resistance state. On the other hand, the non-selected memory cell MC1 is applied with a voltage of $V_{reset1}/2$ or 0 V. Thus, the non-selected memory cell MC1 is not reset. Accordingly, data is erased from the selected memory cell MC1. Also at this time, all the memory cells MC2 are placed in the high resistance state, and all the write word lines 29 are placed at 0 V or in the floating state. Thus, no substantial current flows from the local bit line 21 to the write word line 29.

Next, the effect of the embodiment is described.

In the memory device 1 according to the embodiment, the write word line 29 is provided and connected to the local bit line 21 through the memory cell MC2. Thus, by controlling the resistance state of the memory cell MC2, the magnitude of the compliance current at the time of setting the memory cell MC1 can be selected to select the resistance value after the memory cell MC1 is set. As a result, multivalued data can be stored in the memory cell MC1. Thus, the memory device 1 has high memory density.

The resistance change film 28 constituting the memory cell MC2 is provided above the local bit line 21. Thus, provision of the resistance change film 28 does not lengthen the arrangement pitch of the local bit lines 21 in the X-direction and the Y-direction. Accordingly, miniaturization of the memory device 1 is not hampered.

The embodiment described above can realize a memory device having high memory density and a method for driving the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A memory device comprising:
a first interconnect extending in a first direction;
a second interconnect extending in a second direction crossing the first direction;
a third interconnect extending in a third direction crossing a plane including the first direction and the second direction;
a fourth interconnect extending in the third direction;

a semiconductor member connected between a first end of the second interconnect and the first interconnect;

a first resistance change film connected between a side surface of the second interconnect and the third interconnect; and a second resistance change film connected between a second end of the second interconnect and the fourth interconnect.

2. The device according to claim 1, wherein the first end and the second end are both ends in the second direction of the second interconnect, and the side surface is a surface facing the first direction of the second interconnect.

3. The device according to claim 1, further comprising:

an electrode placed on the first direction side of the semiconductor member and extending in the third direction.

4. The device according to claim 1, wherein the second resistance change film includes:

a nonlinear resistance layer having a resistance value depending on voltage; and a resistance change layer, and the nonlinear resistance layer and the resistance change layer are connected in series between the second interconnect and the fourth interconnect.

5. The device according to claim 4, wherein the nonlinear resistance layer contains silicon, nitrogen, and at least one of tantalum and titanium.

6. The device according to claim 1, wherein the second resistance change film can assume three or more states different in resistance value.

7. The device according to claim 6, further comprising:

a control circuit, wherein the control circuit brings the semiconductor member into conduction and applies a first voltage, a second voltage of opposite polarity to the first voltage, or a third voltage having the same polarity as the second voltage and having a larger absolute value than the second voltage between the first interconnect and the fourth interconnect.

8. The device according to claim 7, wherein the control circuit changes a resistance value of the first resistance change film into a value corresponding to the second voltage by applying a voltage between the fourth interconnect and the third interconnect, after applying the second voltage between the first interconnect and the fourth interconnect, and the control circuit changes a resistance value of the first resistance change film into a value corresponding to the third voltage by applying a voltage between the fourth interconnect and the third interconnect, after applying the third voltage between the first interconnect and the fourth interconnect.

9. The device according to claim 7, wherein the control circuit brings the semiconductor member into conduction and applies a voltage between the first interconnect and the third interconnect after applying the first voltage between the first interconnect and the fourth interconnect while data is read.

10. The device according to claim 7, wherein the control circuit turns the first resistance change film to a state of highest resistance value by bringing the semiconductor member into conduction and applying a voltage between the first interconnect and the third interconnect after applying the first voltage between the first interconnect and the fourth interconnect.

11. The device according to claim 7, wherein the control circuit changes a resistance value of the first resistance change film into a value corresponding to the second voltage by applying a voltage between the fourth interconnect and the third interconnect, after bringing the semiconductor member into conduction and applying the second voltage between the first interconnect and the fourth interconnect, or the control circuit changes a resistance value of the first resistance change film into a value corresponding to the third voltage by applying a voltage between the fourth interconnect and the third interconnect, after bringing the semiconductor member into conduction and applying the third voltage between the first interconnect and the fourth interconnect, then the control circuit brings the semiconductor member into conduction and applies the first voltage between the first interconnect and the fourth interconnect.

* * * * *